United States Patent [19]

Bloom et al.

[11] Patent Number: 4,681,449

[45] Date of Patent: Jul. 21, 1987

[54] HIGH SPEED TESTING OF ELECTRONIC CIRCUITS BY ELECTRO-OPTIC SAMPLING

[75] Inventors: David M. Bloom; Brian H. Kolner, both of Menlo Park, Calif.

[73] Assignee: Stanford University, Stanford, Calif.

[21] Appl. No.: 648,456

[22] Filed: Sep. 7, 1984

[51] Int. Cl.$^4$ ................................. G01J 4/00
[52] U.S. Cl. ................................. 356/364; 356/365; 324/77 K
[58] Field of Search ............ 350/400, 172, 173; 324/77 K, 96; 356/364, 365, 369

[56] References Cited

U.S. PATENT DOCUMENTS

| | | | |
|---|---|---|---|
| 3,556,662 | 5/1968 | Levenstein et al. | 356/365 |
| 3,614,451 | 10/1971 | Gunn | 324/96 |
| 3,902,805 | 9/1975 | Redner | 356/365 |
| 4,053,763 | 10/1977 | Harney | 350/72 |
| 4,446,425 | 5/1984 | Valdmanis et al. | 324/96 |
| 4,603,293 | 7/1986 | Mourou et al. | 324/96 |

OTHER PUBLICATIONS

"Electro-Optic Sampling: Testing Picosecond Electronics Part II Applications", Valdmanis & Mourou, *Laser Focus/Electro-Optics*, 3/1986, pp. 96–106.
"Internal Microwave Propagation and Distortion Characteristics of Travelling-Wave Amplifiers Studied by Electro-Optic Sampling", Rodwell et al., *1986 IEEE MTT-S Digest*, pp. 333–336.
"Direct Electro-Optic Sampling of Analog and Digital GaAs Integrated Circuits", Freeman et al., 1985 IEEE GaAs IC Symposium, pp. 147–150.
"Gate Propagation Delay and Logic Timing of GaAs Integrated Circuits Measured by Electro-Optic Sampling", Rodwell et al., *Electronics Letters*, 4/24/86, pp. 499–501.
"Electrooptic Sampling of Gallium Arsenide Integrated Circuits", Weingarten et al., 6/1986 Topical Meeting on Ultrafast Phenomena.
"Internal Microwave Propagation and Distortion Characteristics of Travelling-Wave Amplifiers Studied by Electrooptic Sampling", Rodwell et al., 11/1986 *IEEE Transactions on Microwave Theory and Techniques*.
"Electro-Optic Sampling of Planar Digital GaAs Integrated Circuits", Freeman et al., *Applied Physics Letters*, 11/15/1985, pp. 1083–1084.
"Direct Picosecond Electro-Optic Sampling of Gate GaAs Integrated Circuits", *Laser Focus/Electro-Optics*, 2/1986, pp. 20–16, Forest.
"Electro-Optic Sampling: Testing Picosecond Electronics Part I Principles and Embodiments", Valdmanis and Mourou, 2/1986, pp. 89–96, *Laser Focus/Electro-Optics*.

*Primary Examiner*—R. A. Rosenberger
*Assistant Examiner*—Crystal D. Cooper
*Attorney, Agent, or Firm*—Flehr, Hohbach, Test, Albritton & Herbert

[57] ABSTRACT

Non-contact measurement of signals up to and beyond 100 GHz is provided by electro-optical sampling the field in a transmission line. A first laser signal is employed to optically generate signals in a III-V compound semiconductor such as gallium arsenide. The signal is transmitted to microstrip on the semiconductor surface, and a second polarized laser signal is passed through the crystal and its polarization is modulated by the electric field in the microstrip. The polarization presents a measure of the field strength and hence the signal. By varying the relative delay between two beams, an equivalent time representation of the sampled signal is obtained.

20 Claims, 7 Drawing Figures

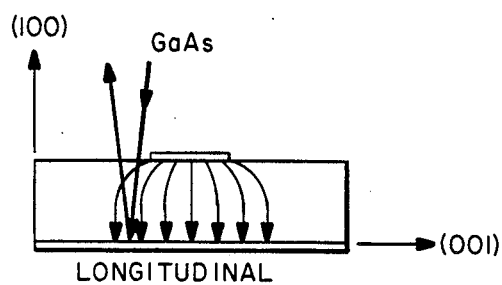
FIG.—2
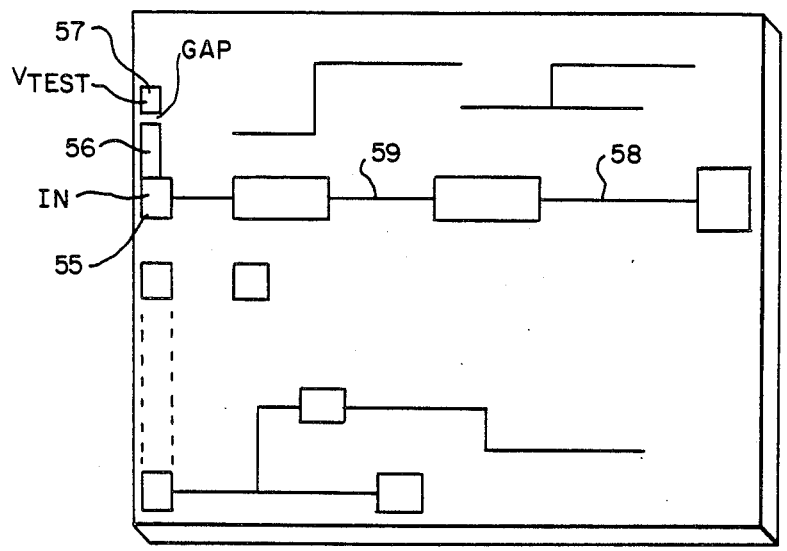
FIG.—4

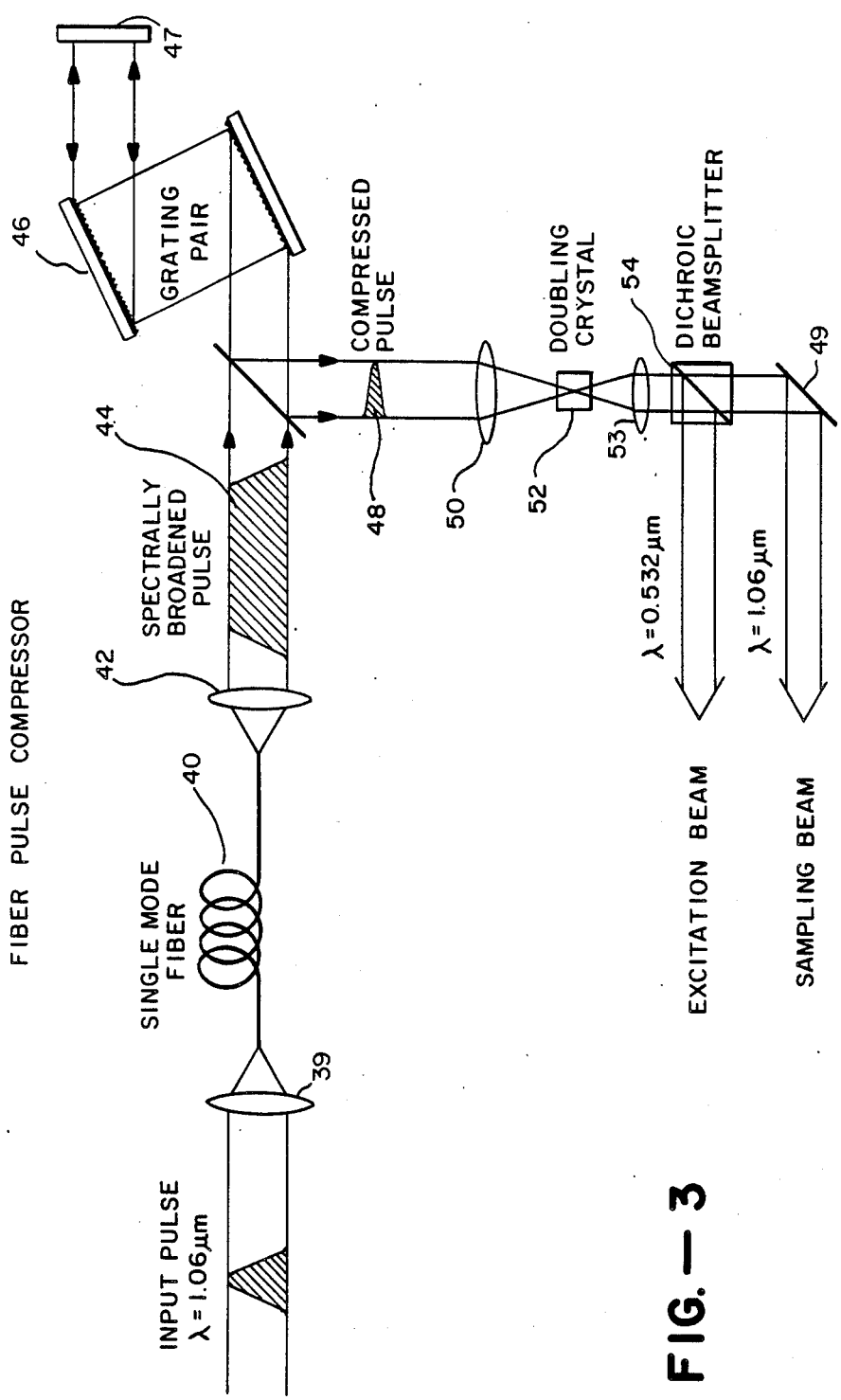
FIG.—3

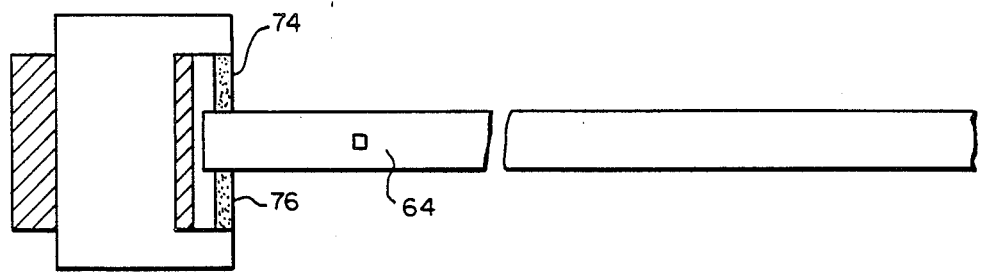
FIG.—5A
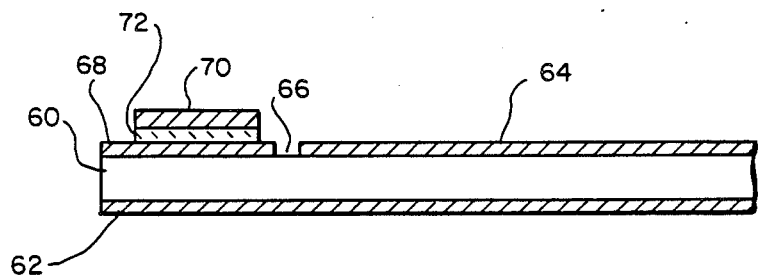
FIG.—5B
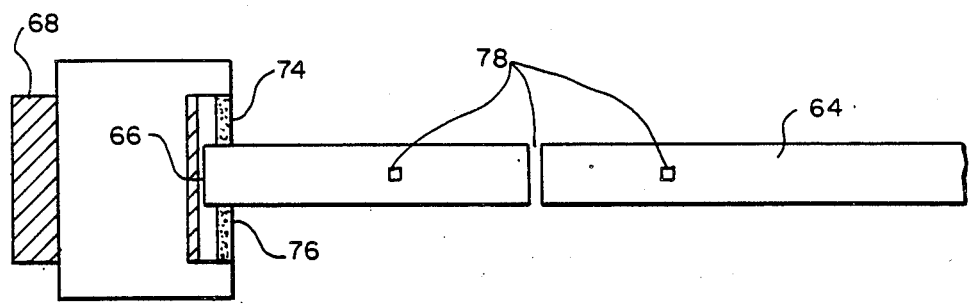
FIG.—6

HIGH SPEED TESTING OF ELECTRONIC CIRCUITS BY ELECTRO-OPTIC SAMPLING

The U.S. Government has rights in the disclosed invention pursuant to O.N.R. contract, No. N00014-84-K-0327.

This invention relates generally to electronic circuits, and more particularly the invention relates to high speed testing of III-V compound integrated circuits using electro-optic sampling.

The testing of integrated circuits designed to operate at frequencies up to 100 GHz becomes impractical and impossible using conventional test probe techniques due to the inductive and capacitive circuit loading introduced by physical probes.

The present invention is directed to an electro-optic sampling technique for testing such circuits. Many group III-V semiconductor compounds, such as gallium arsenide, exhibit an electro-optic effect which allows the direct probing of electric fields in the material with optical beams. By using ultrafast photodiodes or photoconductive switches on the gallium arsenide as signal sources, simultaneous non-contact signal generation and sampling is achieved. The high speed capabilities of this non-contact testing far exceeds the performance of any direct electronic approach.

In one embodiment a dual wave length pico-second optical source is used to simultaneously excite a gallium arsenide photodiode and measure the birefringence induced by the gallium arsenide transmission line by the electro-optic effect. Gallium arsenide has a bandgap of 0.890 nanometer, and an impinging optical wave having a shorter wavelength will generate electron-hole pairs in the photodiode. By frequency doubling a 1.064 micron optical wave from a laser source a 0.532 micron beam is utilized to excite a gallium arsenide photodiode, and the 1.064 micron wave passes into the gallium arsenide adjacent to the microstrip transmission line, reflects off the ground plane and exits. The field effect of the transmission line on the polarization of the reflected wave is then measured as an indication of signal strength in the transmission line.

In one application of the invention on-chip electronic signal generators are employed in testing integrated circuits. By utilizing the electro-optic effect in the semiconductor material in conjunction with novel optical geometry, flexible and sensitive non-contact probing of circuit voltages is possible. Thus, wafer level testing of high speed integrated circuits is accomplished using integrated photo detectors as on chip electronic signal generators and using electro-optic sampling for probing high speed circuit responses. Advantageously, multiple sampling points can easily be incorporated in the device under test.

Accordingly, an object of the invention is a method of non contact testing of electronic circuitry.

Another object of the invention is apparatus for electro-optic sampling and testing of an integrated circuit.

A feature of the invention is the use of polarization effects on a sampling beam transmitted through and reflected from an electronic waveguide as a measure of a signal in the waveguide.

Another feature of the invention is the use of optoelectronic step function generators and pulse generators in an integrated circuit for use in on chip electro-optic sampling and testing.

Still another feature of the invention is the use of a two wavelength pico-second optical source for providing a shorter wavelength pulse for excitation of semiconductor material and a longer wavelength pulse for probing the electric field in the semiconductor material.

The invention and objects and features thereof will be more readily apparent from the following detailed description and appended claims when taken with the drawing, in which:

FIG. 2 is a section view of microstrip transmission line in the apparatus of FIG. 1.

FIG. 3 is a schematic diagram of apparatus for producing dual optical beams for use in the apparatus of FIG. 1.

FIG. 4 is a perspective view of an integrated circuit utilizing electro-optic sampling in accordance with the invention.

FIGS. 5A and 5B are a top view and a side view in section of a step function generator useful in the circuit of FIG. 4.

FIG. 6 is a top view of a pulse generator useful in the circuitry of FIG. 4.

Figure 1:
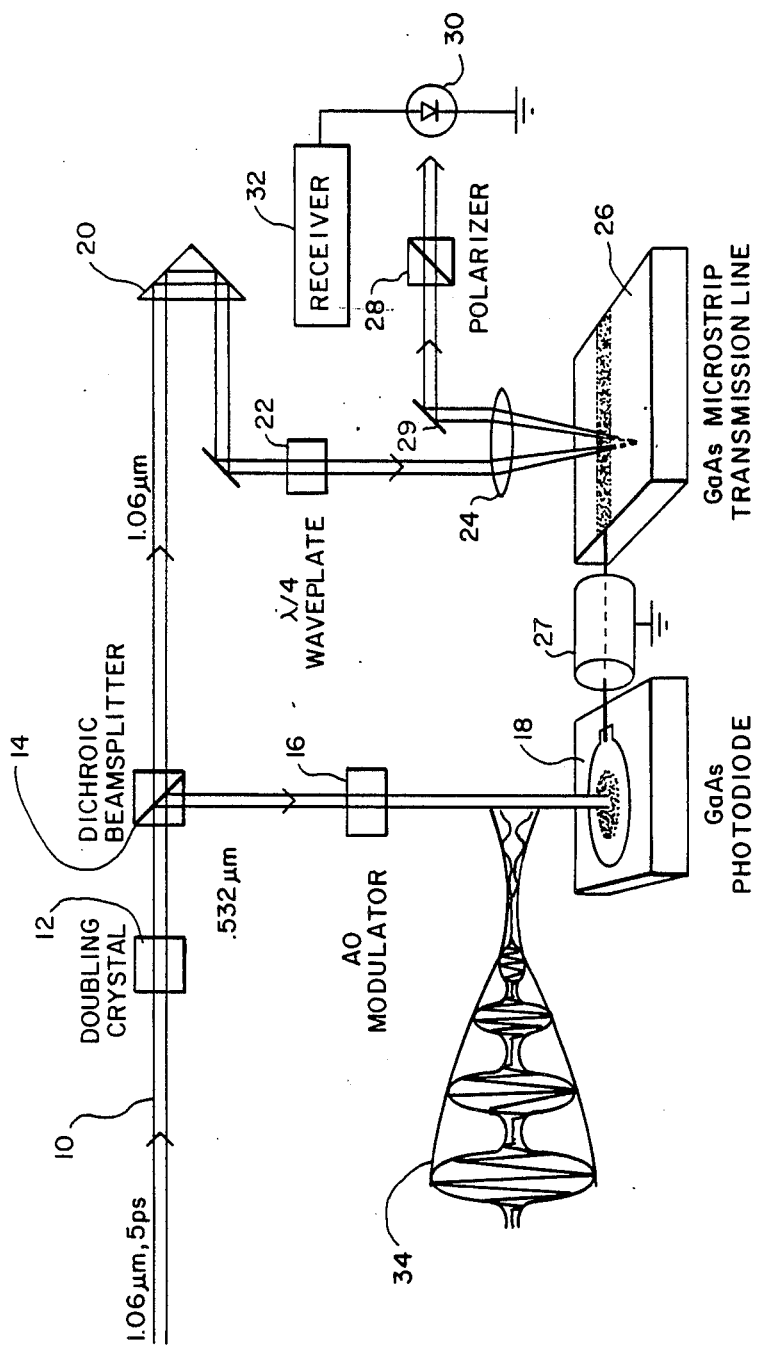
FIG. 1 is a schematic diagram of one embodiment of test apparatus using electro-optic sampling in accordance with the invention.

Referring now to the drawings, FIG. 1 is a schematic diagram of one embodiment of test apparatus using electro-optic sampling for testing a semiconductor device in accordance with the present invention. In this embodiment a light beam at 1.064 microns in five picosecond pulses 10 is applied to a frequency doubling crystal 12 and thence to a dichroic beam splitter 14. Beam splitter 14 separates the light beam at the double frequency having a wavelength of 0.532 micron and the original optical signal at 1.064 microns. The 0.532 micron optical wave is applied through an acousto optic modulator 16 to excite a gallium arsenide photodiode 18. The 0.532 micron wavelength has an energy greater the bandgap of gallium arsenide and thus generates electron-hole pairs in the gallium arsenide material. The planar photodiode is fabricated on a semi-insulating gallium arsenide substrate with [100] crystal axis orientation. A 0.4 micron thick N+ gallium arsenide layer and a 0.3 micron thick N- gallium arsenide layer are grown successively via liquid phase epitaxy. The N- gallium aresenide has a free electron concentration of $1 \times 10^{17}$ per cubic centimeter.

The 1.064 micron optical wave is transmitted through a reflector 20 which functions as a variable delay stage and then passes through a quarter-wave plate 22 which changes the beam to circular polarization, and a focusing lens 24 to test the birefringence of a gallium arsenide microstrip transmission line 26 through which the modulated signal generated by photodiode 18 is transmitted via transmission line 27, as illustrated in FIG. 2. The electric field around the microstrip alters the polarization of the reflected signal in proportion to the field strength and the reflected optical wave is then passed through a polarizer 28 to photodetector 30 the polarizer and photodetector functioning as an analyzer/discriminator. The polarizer converts the change in polarization to a change in beam intensity. Photodetector 30 generates an electrical signal in proportion to the intensity of the wave, as modulated by the birefringence of the transmission line, and the electrical signal is then measured by a receiver 32. Thus, the magnitude of the signal as detected by receiver 32 provides a measure of the signal generated by photodiode 18 and the electrical characteristics of the transmission line 26.

In one embodiment a Spectra Physics Model 3000 CW mode locked Nd:YAG laser was utilized to radiate 80 picosecond pulses at an 82 MHz rate. These pulses are too long to be used for high speed sampling. However, by employing a fiber grating pulse compressor such as a Spectra Physics Model 3600 fiber grating pulse compressor, five picosecond pulses at 1.064 micrometer wavelength are obtained. This is illustrated in the schematic of FIG. 3 and as described by Kolner, B. H., Kafka, J. D., Bloom, D. M., And Baer, T. M., "Compression of Mode Locked Nd:YAG Pulses to 1.8 Picoseconds", *The Proceedings of the Topical Meeting of Ultrafast Phenomena*, June 12–15, 1984, Monterey, Calif. Briefly, as illustrated in FIG. 3, the input pulses from the mode locked laser are applied through lens 39 to a single mode fiber 40 and lens 42 to produce a spectrally broadened pulse as shown at 44. The pulse 44 is then passed through the grating pair shown at 46 including mirror 47 which produces the compressed pulse as shown at 48. The compressed pulse 48 is then passed through a lens 50, frequency doubler 52 and lens 53 and then split by dichroic beam splitter 54 to produce the excitation beam at 0.532 micrometer and sampling beam at 1.064 micrometer which is reflected by mirror 49. Frequency doubler 52 and beam splitter 54 correspond to frequency doubler 12 and beam splitter 14 in FIG. 1.. Again referring to FIG. 1, The acousto-optic modulator 16 is used to amplitude modulate the 82 MHz pulse train at 20.9 megahertz, as shown by envelope 34. This frequency is chosen to be above the excess noise produced by the Nd: YAG laser and pulse compressor. The beam power is reduced to a few milliwatts before being focused on the Schottky photodiode 18. The remaining power in the 1.064 micrometer sampling beam is routed through the right angle prism 20 mounted on a stepper motor driven delay stage which provides a variable delay of up to 500 picoseconds. The beam is passed through the quarter wavelength plate 24 adjusted for circular polarization and then focused into the gallium arsenide adjacent to the microstrip transmission line 26. Electric fields from the transmission line along the 100 crystal axis induce birefringent axes along the 011 and 011 directions. As the circularly polarized probe beam passes in and out of the crystal, the voltage induced birefringence elliptically polarizes the light which is received and reflected by mirror 29 and then analyzed with the polarizer 28 oriented along 010. The photodiode 30 detecting the sampling beam is followed by a narrow band receiver 32, for example an HP 8566B spectrum analyzer tuned to 20.9 megahertz. As the time delay between the excitation and sampling pulse is changed, the intensity of the sampling beam (and hence the magnitude of the signal at 20.9 megahertz) maps out the equivalent photodiode response.

The invention is readily incorporated in the design of integrated circuits as shown in FIG. 4. In this embodiment of an integrated circuit, a signal input pad 55 is provided with a conductive extension 56 which is separated from a test pad, $V_{test}$, shown at 57. The gap between the conductive extension 56 and the test pad 57 is utilized for generating a test signal as will be described with reference to FIGS. 4, 5A and 5B hereinbelow. A test signal generated by illuminating the gap between pad 57 and conductive extension 56 is applied through the input pad 55 to circuitry having microstrip conductive lines as shown at 58 and 59. The electro-optic sampling technique described with reference to FIG. 1 is then employed to test the signal in the microstrip 56, 59 as described above.

FIGS. 5A and 5B are a top view and a side view in section illustrating a step function generator in accordance with a feature of the invention. As shown in FIG. 5B a gallium arsenide substrate 60 having a [100] orientation has a ground plane conductive layer 62 on one major surface and a microstrip transmission line 64 on an opposite surface. Spaced from the microstrip layer 64 by the five micron gap 66 is a conductive layer 68 on the surface of the substrate 60 and a second conductive layer 70 supported on the metal layer 68 and spaced therefrom by an insulative layer 72. Conductor 70 functions as a bypass capacitor which must be connected to ground through suitable vias (not shown). By electrically biasing the metal layer 68 and illuminating the gap 66 with a short wavelength optical signal the device operates as a step function generator in applying a step function signal to the microstrip 64. Resistors 74, 76 connect microstrip layer 64 to the layer 68 for charge dissipation after a test signal is removed.

FIG. 6 is a plan view of a similar device which functions as a pulse generator. The same reference numerals are employed as in FIGS. 5A and 5B. However, in FIG. 6 a second five micron gap 78 is provided in the microstrip 64 and functions as a series capacitor and differentiator of the step function pulse generated at the gap 66. In this embodiment the resistors 74 and 76 permit charge dissipation from the microstrip back to the conductor 68 after a test signal is removed.

The heart of the sampling system is the microstrip transmission line deposited on an electro-optic crystal and used as the active element in a Pockels cell amplitude light modulator. The train of pulses from the mode locked laser is split into two beams; one beam strikes the photodiode and launches a signal to the transmission line. The other beam passes into the crystal adjacent to the transmission line and its polarization is modulated by the electric field near the transmission line, thus sampling the signal. By varying the relative delay between the two beams, an equivalent time representation of the photodiode response is obtained. The temporal resolution is determined by several factors including the sampling light beam spot size, the optical transit time, and the laser pulse duration.

The invention has proved to be particularly useful in testing transmission line responses to signals up to 100 gegahertz, and the technique appears to be feasible for speeds up to 500 gegahertz. While the invention has been described with reference to specific embodiments, the description is illustrative of the invention and is not to be construed as limiting the invention. For example, the electrical signal generator can be an external signal generator such as a synthesized sweeper, and the transmission line can be coplanar strip guide, coplanar waveguide, or slot line which do not utilize a ground plane. Thus, various modifications and applications may occur to those skilled in the art without departing from the true spirit and scope of the invention as defined by the appended claims.

What is claimed is:

1. A method of testing an electronic circuit including a transmission line on a substrate of semiconductor material exhibiting linear electro-optic effect comprising the steps of
generating an electrical signal,
transmitting said electrical signal to said transmission line,
applying a circularly polarized optical wave perpendicular to said transmission line whereby a longitudinal electrical field component from said transmission line created by said electrical signal and parallel to said optical wave distorts the polarization of said polarized optical wave, receiving a reflection of said polarized optical wave, passing said reflection of said polarized optical wave through an analyzer/discriminator, and measuring said reflection of said polarized optical wave after passing through said analyzed/discriminator.

2. The method as defined by claim 1 wherein said electronic circuit comprises a group III–V semiconductor integrated circuit and said step of generating an electrical signal includes applying a laser generated optical signal on an electro-optical device in said integrated circuit.

3. The method as defined by claim 2 wherein said transmission line comprises microstrip on said integrated circuit and said step of applying a circularly polarized optical wave includes applying a second laser generated optical signal to said microstrip and transmission line, said first and second laser generated optical signals being generated by the same laser source.

4. The method as defined by claim 3 wherein said step of applying a laser generated optical signal includes acousto optically modulating said signal.

5. The method as defined by claim 4 wherein said step of generating an electrical signal further includes exciting a photodiode in said integrated circuit.

6. The method as defined by claim 4 wherein said step of generating an electrical signal further includes creating electron-hole pairs in semiconductor material in a gap between two conductors thereby interconnecting said two conductors.

7. The method as defined by claim 6 wherein said two conductors comprise part of a step function generator.

8. The method as defined by claim 6 wherein said two conductors comprise part of a pulse generator.

9. Apparatus for testing an electronic circuit including a transmission line comprising means for generating an electrical signal, means for transmitting said said electrical signal to said transmission line, means for applying a polarized optical wave perpendicular to said transmission line whereby a longitudinal electrical field from said transmission line created by said electrical signal and parallel to said optical wave distorts the polarization of said polarized optical wave, optical means for receiving a reflection of said polarized optical wave, analyzer/discriminator means for receiving said reflection of said polarized optical wave, and means connected to said analyzed/discriminator for receiving and measuring said reflection of said polarized optical wave after passing through said analyzer/discriminator.

10. Apparatus as defined by claim 9 wherein said electronic circuit comprises a Group III–V semiconductor integrated circuit and said means for generating an electrical signal includes laser means and means for applying a light beam from said laser on an electrooptical device in said integrated circuit.

11. Apparatus as defined by claim 10 wherein said transmission line comprises microstrip on said integrated circuit and wherein said means for applying a polarized optical wave includes doubling crystal means and dichroic beam splitter means for applying a light beam from said laser means on said microstrip transmission line.

12. Apparatus as defined by claim 11 wherein said means for generating said electrical signal further includes acousto optical modulation means for modulating said first optical beam.

13. Apparatus as defined by claim 12 wherein said means for generating electro signal further includes a photo diode in said integrated circuit.

14. Apparatus as defined by claim 12 wherein said means for generating electrical signal further includes first and second conductors on said integrated circuit with a gap therebetween, said first optical beam creating electron hole pairs in semiconductor material in said gap.

15. Apparatus as defined by claim 14 wherein said two conductors comprise part of a step function generator.

16. Apparatus as defined by claim 14 wherein said two conductors comprise part of a pulse generator.

17. A method of testing for voltage in an integrated circuit including an electrical conductor on a surface of a semiconductor substrate exhibiting linear electro-optic effect comprising the steps of applying a circularly polarized optical wave through said substrate perpendicular to said surface whereby longitudinal electrical field components created by an electrical voltage on said electrical conductor distort polarization of said optical wave, and determining change in polarization of said optical wave as a measure of said electrical voltage.

18. The method as defined by claim 17 wherein the step of determining change in polarization includes passing the optical wave through an analyzer/discriminator, and measuring the magnitude of said wave after passing through said analyzer/discriminator.

19. Apparatus for testing for voltage in an integrated circuit having an electrical conductor on a surface of a semiconductor substrate exhibiting linear electro-optic effect comprising means for applying a circularly polarized optical wave through said substrate perpendicular to said surface whereby longitudinal electrical field components created by an electrical voltage on said electrical conductor change polarization of said optical wave, and means for determining change in polarization of said optical wave as a measure of said electrical voltage.

20. Apparatus as defined by claim 19 wherein said means for determining change in polarization comprises an analyzer/discriminator means for receiving the optical wave, and means connected to said analyzer/discriminator for measuring amplitude of said optical wave after passing through said analyzer/discriminator.

* * * * *

UNITED STATES PATENT AND TRADEMARK OFFICE
CERTIFICATE OF CORRECTION

PATENT NO. : 4,681,449
DATED : July 21, 1987
INVENTOR(S) : Bloom et al.

It is certified that error appears in the above-indentified patent and that said Letters Patent is hereby corrected as shown below:

Column 1, lines 4-6 should be deleted and substitute therefor the following sentence:

--This invention was made with Government support under contract N00014-84-K-0327 awarded by the Department of the Navy. The Government has certain rights in this invention.--

Signed and Sealed this

Fifteenth Day of August, 1995

Attest:

BRUCE LEHMAN

*Attesting Officer*    *Commissioner of Patents and Trademarks*